United States Patent
Kou et al.

(10) Patent No.: US 8,898,546 B1
(45) Date of Patent: Nov. 25, 2014

(54) ERROR RECOVERY USING ERASURES FOR NAND FLASH

(75) Inventors: Yu Kou, San Jose, CA (US); Xiangyu Tang, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 183 days.

(21) Appl. No.: 13/607,302

(22) Filed: Sep. 7, 2012

Related U.S. Application Data

(60) Provisional application No. 61/539,833, filed on Sep. 27, 2011.

(51) Int. Cl.
*G11C 29/00* (2006.01)
*H03M 11/00* (2006.01)
*G01R 31/30* (2006.01)

(52) U.S. Cl.
USPC ............ 714/773; 714/719; 714/745; 714/774

(58) Field of Classification Search
USPC ......... 714/773, 758, 745, 782, 781, 786, 787, 714/794–795, 774–775, 751–753, 701, 48, 714/52, 719
See application file for complete search history.

(56) References Cited

U.S. PATENT DOCUMENTS 8,522,109 B2 * 8/2013 Murakami et al. ............ 714/755
2013/0297993 A1 * 11/2013 Murakami .................... 714/786

* cited by examiner

*Primary Examiner* — Christine Tu
(74) *Attorney, Agent, or Firm* — Van Pelt, Yi & James LLP

(57) ABSTRACT

Data is processed by selecting one or more bits in a codeword to replace with an erasure. The selected bits in the codeword are replaced with the erasure and error correction decoding is performed on the codeword with the erasure in place for the selected bits.

21 Claims, 8 Drawing Sheets

| Bit Line 1 | | | Bit Line 2 | | | |
|---|---|---|---|---|---|---|
| LLR before ECD | LLR after ECD | $|\Delta|$ | LLR before ECD | LLR after ECD | $|\Delta|$ | |
| 12 | 15 | 3 | -8 | -15 | 7 | Word Line 1 |
| -9 | -15 | 6 | 1 | 15 | 14 | Word Line 2 |
| -13 | -15 | 2 | 9 | -15 | 24 | Word Line 3 |
| 🚫 | 🚫 | 🚫 | 🚫 | 🚫 | 🚫 | Word Line 4 |
| Accumulated $|\Delta|$ = 11 | | | Accumulated $|\Delta|$ = 45 | | | |

FIG. 5

ERROR RECOVERY USING ERASURES FOR NAND FLASH

CROSS REFERENCE TO OTHER APPLICATIONS

This application claims priority to U.S. Provisional Patent Application No. 61/539,833 entitled RECOVERING UNCORRECTABLE PAGES RESULTING FROM CELL DEFECT IN SOLID STATE DRIVES filed Sep. 27, 2011 which is incorporated herein by reference for all purposes.

BACKGROUND OF THE INVENTION

Solid state storage systems store information as voltages (e.g., as opposed to optically stored information or magnetically stored information). Error correction codes are often used in solid state storage systems, for example to correct for manufacturing defects in cells (e.g., stuck high or stuck low faults) and/or to correct for the leakage of voltage through the semiconductor material of cells over time. In some cases, however, the noise or error in a signal read back from solid state storage exceeds the error correction capability of a code. New error recovery techniques (e.g., which are employed when default or regular error correction decoding processes fail) would be desirable for such situations. Such error recovery techniques may be able to (for example) correct certain errors which current error recovery techniques are unable to successfully decode.

BRIEF DESCRIPTION OF THE DRAWINGS

Various embodiments of the invention are disclosed in the following detailed description and the accompanying drawings.

FIG. 5 is a diagram showing an embodiment of accumulated values based on LLR values before and after error correction decoding.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
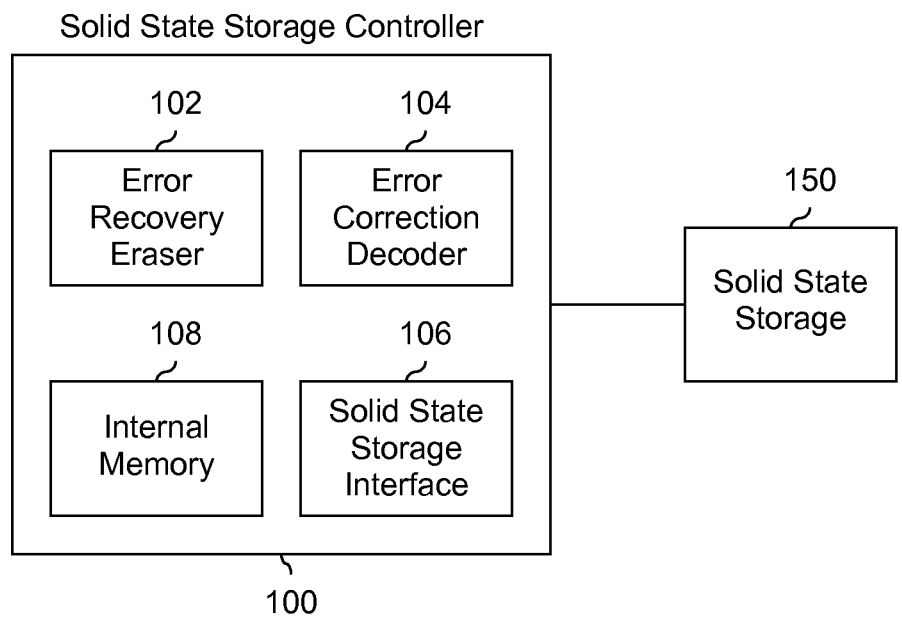
FIG. 1 is a diagram showing an embodiment of a system which performs error recovery using erasures.

FIG. 1 is a diagram showing an embodiment of a system which performs error recovery using erasures. In the example shown, solid state storage controller 100 is used to store information in solid state storage 150, including by writing to and reading from solid state storage 150. In some embodiments, solid state storage controller 100 includes one or more semiconductor components, such as an application-specific integrated circuit (ASIC), a field-programmable gate array (FPGA), or an embedded processor (e.g., an ARM core). In some embodiments, solid state storage 150 includes NAND Flash. In some embodiments, solid state storage 150 includes NOR Flash or other types of solid state storage. Although some examples described herein are NAND Flash embodiments (e.g., where reads and programs are performed at the page level and erasures are performed at the block level), error recovery using erasures is not necessarily limited to NAND Flash.

Solid state storage interface 106 is used to write information to and read information from solid state storage 150. In some embodiments, solid state storage interface 106 reads back soft information from solid state storage 150. For example, error correction decoder 104 may be configured to input soft information (e.g., a low-density parity-check (LDPC) decoder which is configured to input soft information). One example of soft information is a log likelihood ratio (LLR) where the sign of the LLR value (e.g., positive or negative) indicates a decision (e.g., 0 or 1) and the magnitude indicates a certainty or likelihood associated with that decision (e.g., the larger the magnitude, the larger the certainty or likelihood). In some other embodiments, information read back from solid state storage 150 by solid state storage interface 106 includes hard information (e.g., a 0 or 1 without any associated likelihood or certainty). In some embodiments, for example, error correction decoder 104 is decoder which takes as input hard information, such as a BCH decoder. Although some embodiments described herein use soft information, the technique is not necessarily limited to soft information embodiments.

When reading back information stored in solid state storage 150, solid state storage interface 106 is used to access solid state storage 150. The information read back from solid state storage 150 is passed to error correction decoder 104 which performs error correction decoding on the information. Most of the time, the amount of noise or errors in the information read back is able to be corrected by error correction decoder 104 (i.e., the noise or error contained in a read back signal is within the error correction capability of a code).

Sometimes, however, error correction decoder 104 is unable to successfully decode the information read back from solid state storage 150. For example, one or more parity checks used by error correction decoder 104 may not resolve to zero, indicating that the decoding attempt is unsuccessful. In such cases, solid state storage controller 100 is configured to use error recovery eraser 102 to select one or more bit(s) in a codeword to replace with an erasure. The following figure describes one embodiment of this in more detail.

Figure 2:
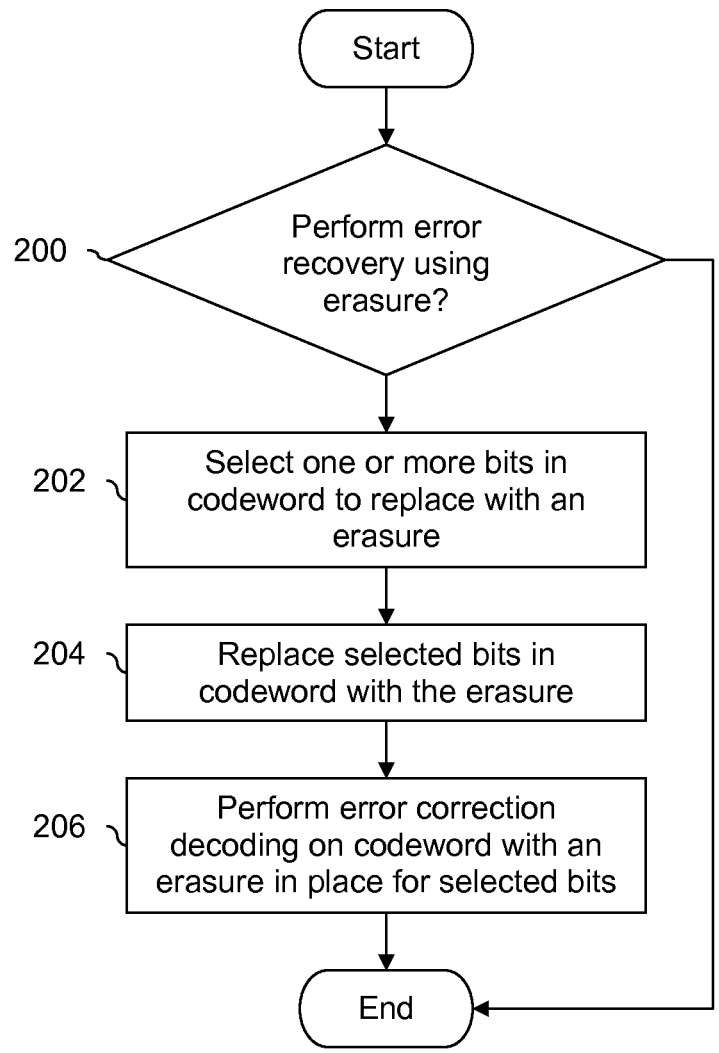
FIG. 2 is a diagram showing an embodiment of an error recovery process which uses erasures.

FIG. 2 is a diagram showing an embodiment of an error recovery process which uses erasures. At 200, it is determined whether to perform error recovery using an erasure. For example, error correction decoding by error correction decoder 104 in FIG. 1 may be attempted first; only if decoder 104 is unsuccessful is it decided to attempt error recovery (at least in this example). In some embodiments, multiple attempts by error correction decoder 104 may be performed before error recovery is performed. In some embodiments, there are multiple error recovery techniques and any number of them may be performed before the error recovery technique described herein.

At 202, one or more bits in a codeword are selected to be replaced with an erasure. For example, a codeword processed at 202 may have failed an initial or default error correction decoding attempt. In some embodiments, a technique which is non-destructive to information stored on solid state storage (e.g., 150 in FIG. 1) is used to select which bits to replace at 202. For example, techniques which only read information from solid state storage (but which does not eliminate or destroy information, for example by erasing a bit to 1 or programming a bit to 0) are non-destructive. In some embodiments, destructive techniques (e.g., which program or erase information on solid state storage) are used to select which bits to replace with an erasure at 202. Some embodiments of both types are described in further detail below.

At 204, the selected bits are replaced in the codeword with an erasure. For example, an LLR value of 0 is an erasure (the number zero is neither positive nor negative and thus an LLR value of 0 is neutral with respect to deciding in favor of either a 0 or a 1). The form or representation of an erasure may depend upon what error correction decoder 104 in FIG. 1 interprets as an erasure.

Error correction decoding is performed on a codeword with an erasure in place for selected bits at 206. By replacing certain bits in a codeword with an erasure, the codeword with the erasures may fall within the error correction capabilities of the code whereas without the erasures the codeword was beyond the error correction capabilities of the code. In some cases, the bits which are replaced with an erasure may have more confidence or certainty assigned to them than ought to be. For example, the erased bits may correspond to cells with defects resulting from manufacturing. Or, the erased bits may correspond to cells which lost stored voltage to an undesirable degree, resulting in an incorrect read back value.

The example process described above may be repeated and/or modified as desired. For example, steps 202, 204, and 206 may be repeated with a different set of bits selected and replaced with an erasure if error correction decoding is unsuccessful yet again (e.g., at step 206). In some embodiments, the number of erasures is increased during a later iteration of steps 202-206.

In some embodiments, step 202 is performed by error recovery eraser 102 in FIG. 1. In some embodiments, a codeword which is processed at step 204 is stored in internal memory 108 in FIG. 1 and the replacement occurs thereon. In some embodiments, step 204 is performed by error recovery eraser 102 in FIG. 1. In some embodiments, error correction decoder 104 in FIG. 1 performs step 206. In some embodiments, a codeword which includes one or more erasures processed at step 206 is stored on internal memory 108 in FIG. 1.

Figure 3:
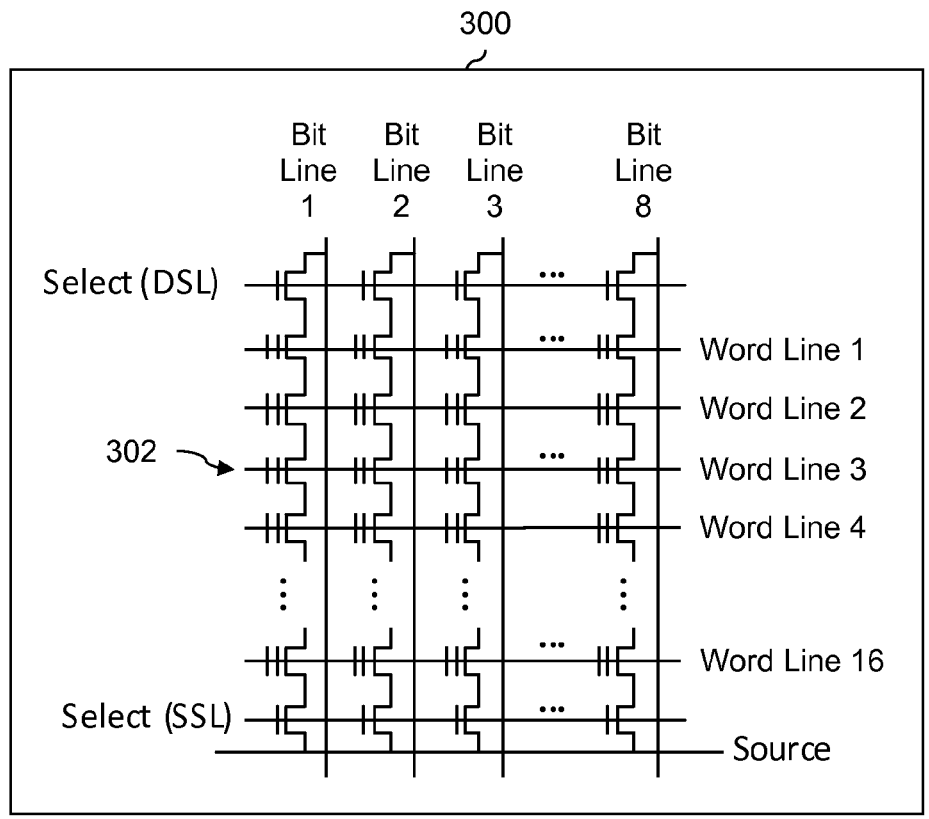
FIG. 3 is a diagram showing an embodiment of solid state storage and an internal memory associated with error recovery using erasures.
Figure 3:
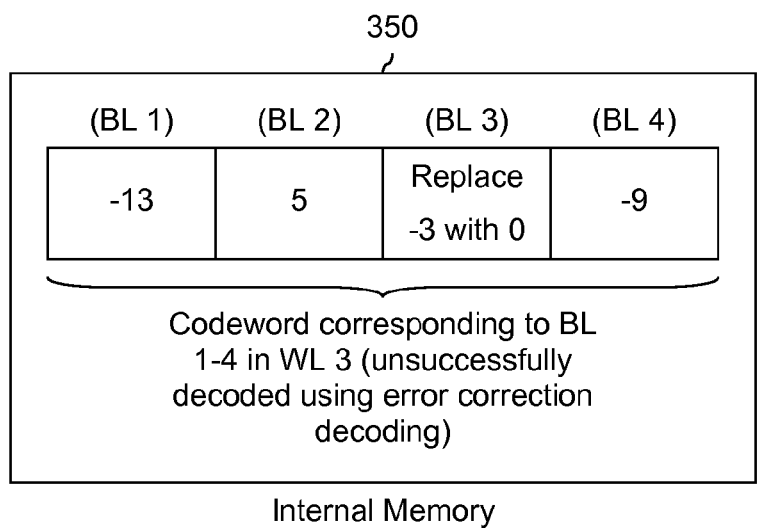

FIG. 3 is a diagram showing an embodiment of solid state storage and an internal memory associated with error recovery using erasures. In the example shown, solid state storage 300 includes a matrix of 8 vertical bit lines and 16 horizontal word lines. In this particular example, each word line includes two codewords; the numbers of bit lines, word lines, and codewords in this figure and which bit lines correspond to which codewords are merely exemplary.

A codeword in word line 3 (302) which corresponds to bit lines 1-4 is unable to be decoded successfully using an error correction decoder. LLR values corresponding to the unsuccessfully decoded codeword are copied from solid state storage 300 to internal memory 350 (e.g., corresponding to internal memory 108 in FIG. 1). The LLR values corresponding to bit lines 1-4 are −13, 5, −3, and −9 where (at least in this example) LLR values range from −15 to 15. In this example, the bit corresponding to bit line 3 is selected to be replaced with an erasure and therefore the LLR value of −3 is replaced with 0 (the LLR value corresponding to an erasure). Error correction decoding is then performed on the codeword consisting of (−13, 5, 0, −9) stored in internal memory 350. As described above, an erasure may comprise a variety of forms or representations and the techniques described herein are not limited to soft information embodiments. In a hard information system, for example, an erasure may be represented in some other manner (e.g., 00 corresponds to 0, 11 corresponds to 1, and 01 or 10 corresponds to an erasure).

Returning to FIG. 2, a variety of techniques may be used to select the one or more bits to replace with an erasure at 202. The following figures describe some non-destructive and destructive embodiments of this.

Figure 4:
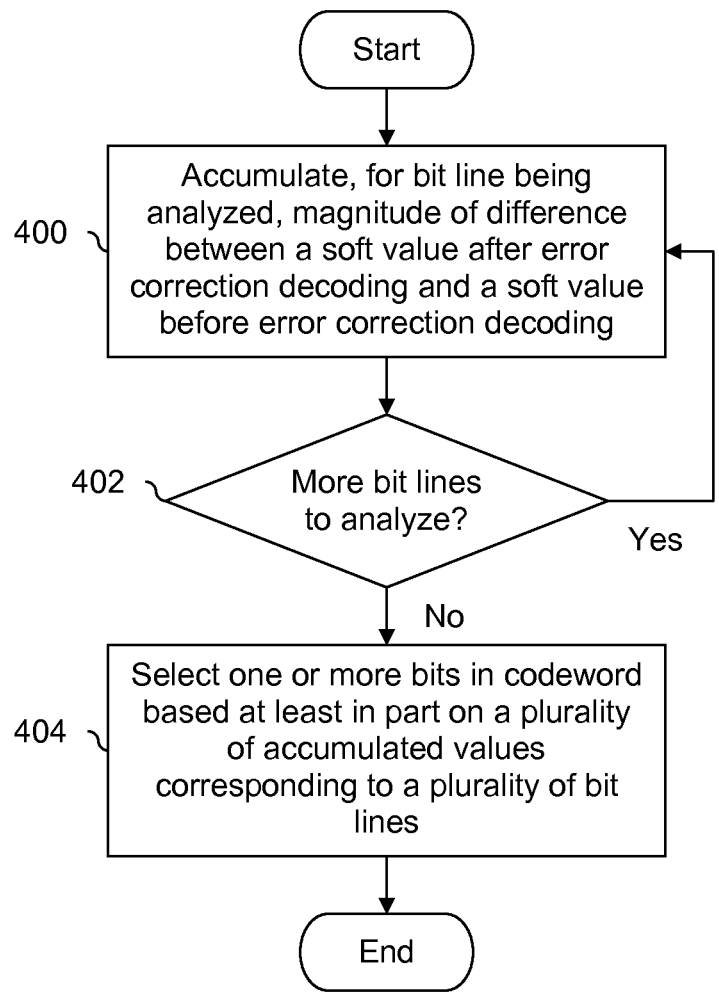
FIG. 4 is a flowchart illustrating an embodiment of a process for selecting one or more bits to replace with an erasure based at least in part on accumulated values.

FIG. 4 is a flowchart illustrating an embodiment of a process for selecting one or more bits to replace with an erasure based at least in part on accumulated values. The example process shown is a non-destructive technique which is able to select one or more bits without deleting information stored in solid state storage. Although this figure and the next show soft information embodiments, the technique is not necessarily to soft information systems.

At 400, a magnitude of a difference between a saturated LLR value after error correction decoding and a soft value before error correction decoding is accumulated for a bit line being analyzed. A bit line analyzed at 400 may intersect (e.g., in solid state storage media) a codeword undergoing error recovery processing using erasures. In one example of step 400 where the soft information includes LLR values, the magnitude of a difference between LLR values before and after error correction decoding for a given bit line at a first word line is added to the magnitude of a difference for the same bit line at a second word line (i.e., $|\Delta|_{(BL\ i, WL\ j)} + |\Delta|_{(BL\ i, WL\ k)}$). In some embodiments, accumulation at 400 only takes into consideration information associated with successfully decoded codewords. Put another way, information associated with unsuccessfully decoded codewords is excluded at 400 in some embodiments.

At 402, it is determined if there are more bit lines to analyze. In some embodiments, all bit lines that are associated with a codeword (e.g., being processed using an error recovery process which uses erasures) are selected and it is decided to continue at 402 if there are more bit lines in that codeword. In some embodiments, it is decided at 402 to continue if there are more bit lines in a page or a block (i.e., accumulation is performed over a page or a block).

If it is determined at 402 that there are more bit lines to analyze, step 400 is repeated for a next bit line. If it is determined at 402 that there are no more bit lines to analyze, one or more bits in a codeword are selected based at least in part on the plurality of accumulated values corresponding to the plurality of bit lines at 404.

In some embodiments, the bits selected at 404 are those which correspond to the (one or more) highest accumulated values. In one example, the bit corresponding to the highest accumulated value is selected. That selected bit is replaced with an erasure (see, e.g., step 204 in FIG. 2) and error correction decoding is performed on the codeword with the erasure in place for the bit with the highest accumulated value (see, e.g., step 206 in FIG. 2). In some embodiments, if error correction decoding is yet again unsuccessful, the two bits corresponding to the highest accumulated value are selected. To put it more generally, in some embodiments the number of bits selected (e.g., corresponding to the highest accumulated values) may increase with each attempt or iteration if error correction decoding continues to be unsuccessful.

In some embodiments, the bits selected at 404 are those which correspond to accumulated values which are greater than some threshold. In some embodiments, a threshold may take into consideration a number of word lines over which the accumulated value is accumulated (e.g., a threshold divided by number of word lines over which accumulation occurs). Alternatively, an accumulated value generated at 400 may be an average $$\left(\text{e.g.,} \frac{\sum |\Delta|}{\text{number of word lines over which accumulation occurs}}\right).$$

The following figure shows an example to demonstrate the process described in FIG. 4.

FIG. 5 is a diagram showing an embodiment of accumulated values based on LLR values before and after error correction decoding. Some embodiments of the process described in FIG. 4 will be demonstrated using the example shown. Although this example shows 2 bit lines and 4 word lines, the technique may be used with any number of bit lines, word lines, and/or codewords.

In the example shown, accumulated values for bit line 1 (500) and bit line 2 (506) are generated using LLR values before and after error correction decoding. Before and after LLR values are shown for each bit line and word line combination. A magnitude of a difference is obtained for each pair of LLR values. For example, the magnitude of the difference for bit line 1 at word line 1 (502) is 3 (i.e., |15-12|), the magnitude of the difference for bit line 1 at word line 2 (504) is 6 (i.e., |-15-(-9)|), and so on.

In this example, the magnitudes of the differences for those codewords which were successfully decoded (e.g., during an initial or default error correction decoding process prior to error recovery) are summed together whereas the magnitudes of the differences for codewords which were not successfully decoded are excluded from the accumulated value. This yields an accumulated value of 11 for bit line 1 (500) and an accumulated value of 45 for bit line 2 (506). In this example, a codeword associated with word line 4 was unsuccessfully decoded and as such those magnitudes (i.e., $|\Delta|_{(BL\ 1, WL\ 4)}=3$ (508) and $|\Delta|_{(BL\ 2, WL\ 4)}=9$ (510)) are excluded from their respective accumulated values (at least in this embodiment). In some applications it may be desirable to use information only from successfully decoded codewords because using information from an unsuccessfully decoded codeword may add additional or new noise or error to the system which was not there previously. This is undesirable since it makes the job of error correction decoding more difficult. Such contamination may be avoided by excluding information from unsuccessfully decoded codewords.

In this particular example, LLR values after error correction decoding are at the highest value or the lowest value (e.g., either 15 or -15 if LLR values range from -15 to 15) for successfully decoded codewords. This may be because one or more parity checks have indicated that the codewords have been successfully decoded and thus an error correction decoder has the highest confidence or certainty in those decisions.

In some embodiments, a bit corresponding to bit line 2 (506) is selected to be replaced with an erasure in a codeword because that bit has the highest accumulated value of the values shown. In some embodiments, those bits which correspond to an accumulated value greater than a threshold are selected to be replaced with an erasure. For example, if a threshold is 30, then the bit corresponding to bit line 2 would be selected, but not the bit corresponding to bit line 1. If a threshold is 10, then both bits would be selected.

In some situations it may be preferable to use non-destructive techniques (some examples of which are described above in FIGS. 4 and 5) because it may be desirable to preserve information stored on solid state storage media (e.g., so that other error recovery techniques may be attempted using the original or raw information). In some embodiments, non-destructive techniques are attempted first, and then destructive techniques are used if non-destructive techniques are unsuccessful. In some embodiments, destructive techniques are used only if permitted by a user, driver, or upper level application. The following figure describes an embodiment of a destructive technique which deletes information on solid state storage media during the process of selecting one or more bits to replace with an erasure.

Figure 6:
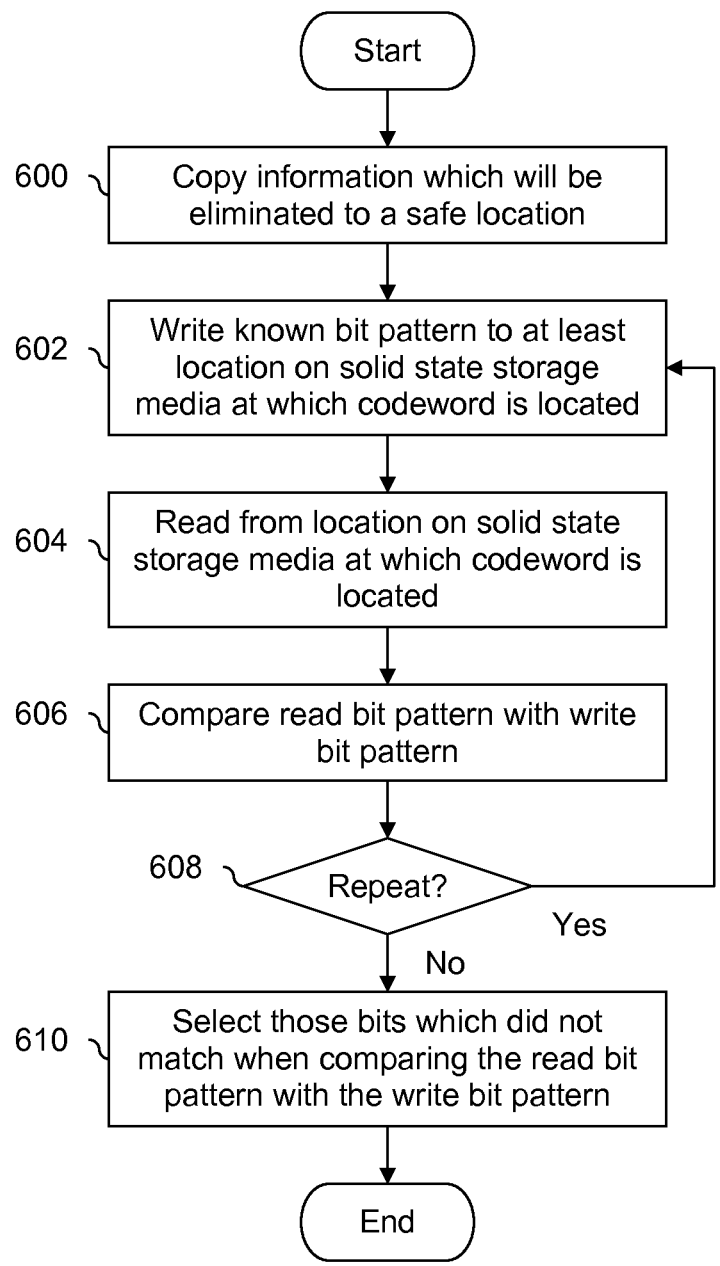
FIG. 6 is a flowchart illustrating an embodiment of a process for selecting one or more bits to replace with an erasure by detecting faulty cells in solid state storage media.

FIG. 6 is a flowchart illustrating an embodiment of a process for selecting one or more bits to replace with an erasure by detecting faulty cells in solid state storage media. The example process shown is a destructive technique which erases information stored in solid state storage media during the process of selecting one or more bits to replace with an erasure. Although FIG. 6 shows a soft information embodiment, the technique is not necessarily limited to soft information embodiments.

At 600, information which will be eliminated is copied to a safe location. For example, if soft information is required for decoding, then all the soft information will be gathered before the page is over-written. This may require reading the page several times at multiple voltage levels to ascertain the voltage in each individual cell. This process may be repeated for each page in the block. The information obtained would be temporarily stored in memory to be used later. At 602, a known bit pattern is written to at least a location on solid state storage media at which a codeword is located. For example, an all 0's pattern, an all 1's pattern, or some combination therefore (e.g., 0101 or 0011) may be written. At 604, the location on solid state storage media at which the codeword is located is read.

A read bit pattern is compared with a write bit pattern at 606. In some NAND Flash systems, an amount of information read (or a read location) may differ from an amount of information written (or a write location). In some such embodiments, if a read bit pattern does not perfectly align with a write bit pattern then read or write bits which have no counterpart may be discarded or ignored during a comparison at 606.

It is decided at 608 whether to repeat the process. For example, during a first iteration an all 1's pattern may be written and during a second iteration an all 0's pattern may be written. If it is decided to repeat the process at 608, a known bit pattern is written at 602. If it is decided not to repeat the process at 608, those bits which did not match when comparing the read bit pattern with the write bit pattern are selected at 610. In some embodiments, one mismatch is enough for a bit to be selected. For example, in a first iteration a pattern of 1111 may be written and a pattern of 1011 is read back. In a second iteration, a pattern of 0000 is written and a pattern of 0000 is read back. Although the second most significant bit matched in the second iteration, the mismatch in the first iteration may be enough for that bit to be selected at 610.

Returning to FIG. 2, selection of one or more bits at 202 in some embodiments includes a priori or known information. The following figure describes an embodiment for recording bits selected to be replaced with an erasure. In some embodiments, a record maintained using the following process is consulted at step 202 and any bit recorded as being previously selected which overlaps with a codeword undergoing error recovery processing using an erasure is selected at 202.

Figure 7:
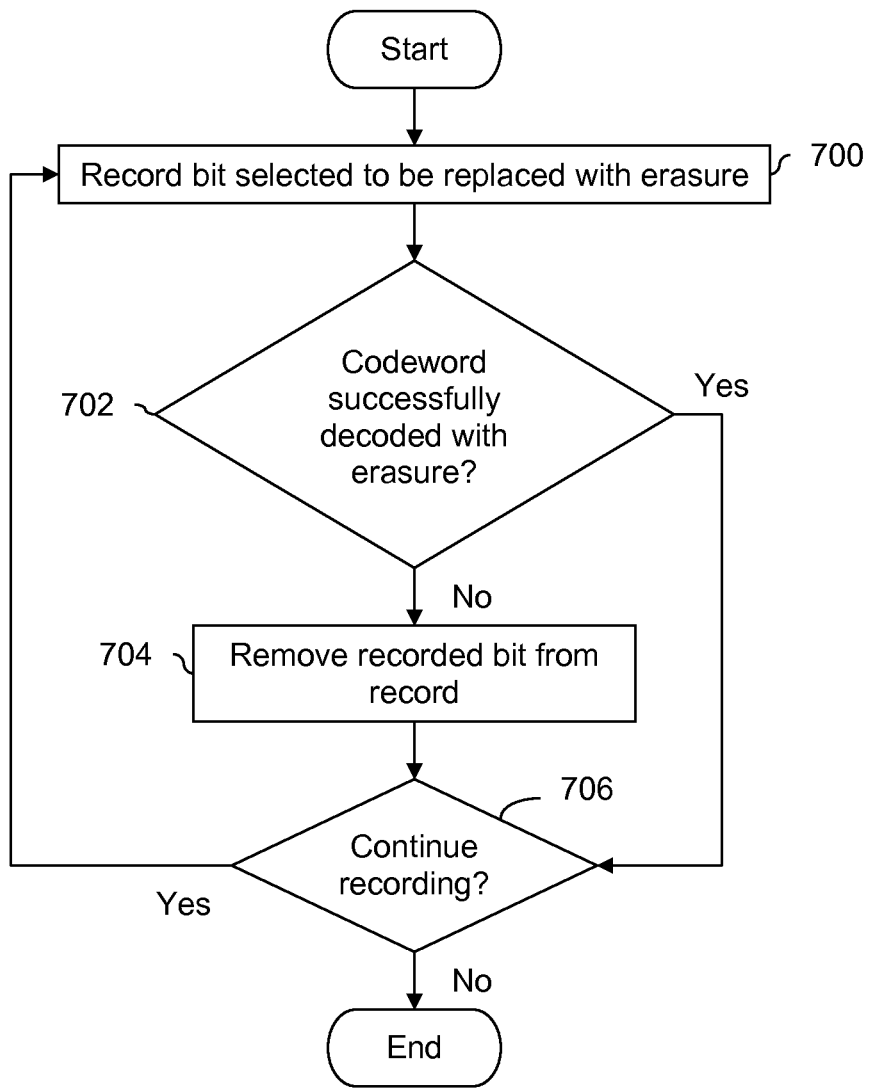
FIG. 7 is a flowchart illustrating an embodiment of a process for recording bits selected for replacement with an erasure.

FIG. 7 is a flowchart illustrating an embodiment of a process for recording bits selected for replacement with an erasure. At 700, a bit selected to be replaced with an erasure is recorded. For example, the process shown in FIGS. 4 and/or the process shown in FIG. 6 may be used to select a bit recorded at 700. Put more generally, a bit recorded at 700 may be selected using non-destructive or destructive techniques. In some embodiments, what is recorded at 700 is a physical location on solid state storage (e.g., because an error may be associated with faulty cells in the solid state storage media). In one example, a combination of page number, bit line, and word line is sufficient to uniquely identify each cell in a solid state storage system and that information (i.e., page number, bit line, and word line) is recorded at 700.

At 702, it is determined whether a codeword was successfully decoded with an erasure. If it was not successfully decoded, a recorded bit is removed from a record at 704. The example process described herein only records those bits which, when replaced with an erasure, result in successful decoding. Those bits have in the past been good bits to replace with an erasure (in that they resulted in successful decoding of the codeword undergoing error recovery processing) and those bits may be good candidates to replace with an erasure in the future. For example, the recorded bits may correspond to cells with a manufacturing defect or may be leaky cells because they were subjected to too many program-and-erase cycles and those performance issues will remain in the future.

After removing a recorded bit from a record at 704 or if a codeword was successfully decoded at 702, it is decided at 706 whether to continue recording. If so, a bit is recorded at 700. In some embodiments, it is decided at 706 to continue running so long as an error recovery process which uses erasures is running. A recording process may stop, for example, when a normal or regular error correction decoding process takes over and an error recovery process is not running.

Although the example process shown in FIG. 7 only records bits locations which result in successful decoding, the technique is not necessarily so limited. In some embodiments, all selected bit locations are recorded without taking into consideration whether replacement of a bit with an erasure resulted in successful decoding or not.

Solid state storage systems include single level cell (SLC) systems where a cell stores a single bit (e.g., a cell stores either a 1 or a 0) and multi level cell (MLC) systems where a cell stores multiple bits (e.g., a 2-bit cell which stores 00, 01, 10, or 11). The following figure describes an embodiment of a MLC system which is configured to perform error recovery using erasures.

Figure 8:
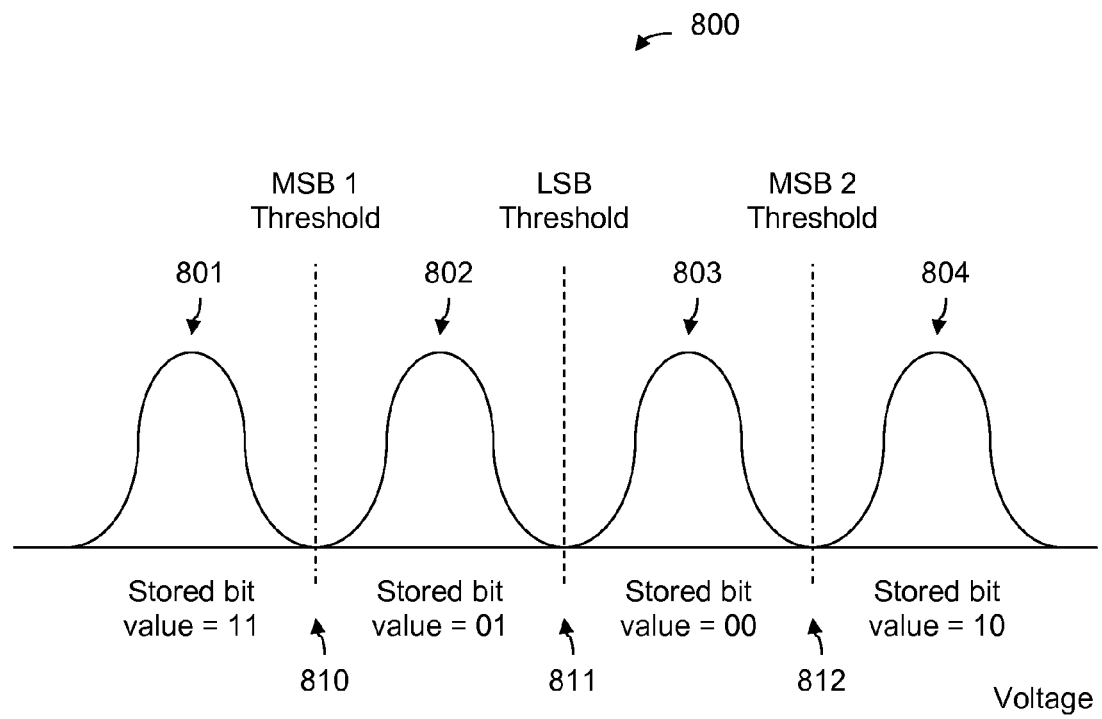
FIG. 8 is a diagram showing an embodiment of voltage distributions associated with a MLC system.

FIG. 8 is a diagram showing an embodiment of voltage distributions associated with a MLC system. In the example shown, a 2-bit MLC system is shown. Cells in solid state storage systems store information in the form of voltage. For a variety of reasons (e.g., manufacturing differences between cells, the gradual leakage of stored voltage over time, resolution and/or accuracy issues when charging or discharging a cell, and so on), the same voltage level is not stored even when the same stored bit value is desired. As a result, voltages have a range of values which are shown as 4 "mounds" in distribution 800. In contrast, a perfect system corresponding to this example would have 4 Dirac delta functions. Portions 801-804 of voltage distribution 800 are interpreted as stored bit values of 11, 01, 00, and 10, respectively.

To differentiate between the various bit values, thresholds 810-812 are used. Least significant bit (LSB) threshold 811 differentiates the LSB. Note, for example, that bit values to the left of LSB threshold 811 have LSB values of 1 (i.e., 1<u>1</u> and 0<u>1</u>) and bit values to the right of LSB threshold 811 have LSB values of 0 (i.e., 0<u>0</u> and 1<u>0</u>). Most significant bit (MSB) thresholds 810 and 812 are used to different the most significant bit. For portions 801 and 802 of voltage distribution 800, MSB threshold 1 (810) is used to differentiate the most significant bit. Similarly, for portions 803 and 804 of voltage distribution 800, MSB threshold 2 (812) is used to differentiate the most significant bit.

In some embodiments where certain selection techniques are used, a bit differentiated by a threshold at or near the midpoint of a distribution (hereinafter referred to as a midpoint threshold) is eligible to be replaced with an erasure and bit(s) differentiated by other thresholds is/are not eligible to be replaced. In this example, the midpoint threshold is LSB threshold 811 and therefore the bit eligible to be replaced with an erasure (in such embodiments at least) is the LSB.

Returning to FIG. 2, eligibility of bits for selection at 202 and replacement at 204 may depend upon the specific technique used. When selection techniques which use information (e.g., soft or hard) before and/or after error correction decoding are used, it may be desirable to limit the eligible bit to that bit which is differentiated by a midpoint threshold. For example, an major error where a stored voltage (e.g., before error correction decoding) falls within portion 801 but the actual or real value should be 10 (i.e., associated with portion 804) may not be detected if the MSB is examined by the processes shown in FIG. 4 and/or 5 since both portions 801 and 804 have 1 as the MSB. Before error correction decoding, for example, a stored voltage or LLR value would fall within portion 801 and the MSB would be interpreted to be a 1. After error correction decoding (even if decoding was successful), the MSB would still be interpreted as a 1 and no change or difference would be observable or noticeable when examining just the MSB. As such, in some embodiments where a selection technique uses information before and/or after error correction decoding (e.g., FIGS. 4 and/or 5), a bit which is eligible for selection (e.g., at 404 in FIG. 4) is limited to that bit which is differentiated by a midpoint threshold (e.g., LSB threshold 811 in FIG. 8). Similarly, the soft values (such as LLR values) which are accumulated (e.g., at step 400 in FIG. 4) may be limited to those associated with a midpoint threshold.

With respect to FIG. 6, however, all bits (including those which are differentiated by a non-midpoint threshold) are eligible to be selected using the example technique described therein. This may be because writing known values to solid state storage media may detect problems associated with all types of bits (e.g., regardless of which threshold a bit is associated with it).

Similarly, the selection technique shown in FIG. 7 is not limited to only those bits which are differentiated by a midpoint threshold. A bit which is not differentiated by a midpoint threshold may, for example, be selected using the technique described in FIG. 6 and then recorded using the technique described in FIG. 7.

Although the example above describes a 2-bit MLC system, the technique may be used with XLC systems of any number of bits. The techniques described herein are also not limited to the threshold and stored bit value assignment shown in FIG. 8. Put another way, in some embodiments, a midpoint threshold is used to different a MSB or some other bit (e.g., a second MSB, a second LSB, etc.).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for processing data, comprising:
a processor; and
a memory coupled with the processor, wherein the memory is configured to provide the processor with instructions which when executed cause the processor to:
select one or more bits in a codeword to replace with an erasure, including by:
selecting the one or more bits in the codeword based at least in part on a
plurality of accumulated values corresponding to a plurality of bit lines; and
generating the plurality of accumulated values, including by accumulating, for a bit line being analyzed, a magnitude of a difference between a soft value after error correction decoding and a soft value before error correction decoding;
replace the selected bits in the codeword with the erasure; and
perform error correction decoding on the codeword with the erasure in place for the selected bits.

2. The system recited in claim 1, wherein the plurality of accumulated values takes into consideration only magnitudes of differences associated with successfully decoded codewords.

3. The system recited in claim 1, wherein the instructions for selecting further include instructions for:
identifying a largest accumulated value in the plurality of accumulated values; and
selecting at least a bit corresponding to the largest accumulated value.

4. The system recited in claim 1, wherein the instructions for selecting further include instructions for:
identifying those accumulated values from the plurality of accumulated values which are greater than an accumulation threshold; and
selecting those bits in the codeword which correspond to the accumulated values which are greater than the accumulation threshold.

5. The system recited in claim 1, wherein the instructions for selecting further include instructions for selecting the one or more bits in the codeword based at least in part on a record associated with previously selected bits.

6. The system recited in claim 5, wherein the memory is further configured to provide the processor with instructions which when executed cause the processor to:
record, in the record associated with previously selected bits, a bit selected to be replaced with an erasure;
determine if a codeword containing an erasure in place of the recorded bit is successfully decoded; and
in the event the codeword containing an erasure in place of the recorded bit is not successfully decoded, remove the recorded bit from the record associated with previously selected bits.

7. The system recited in claim 1, wherein the system includes a multi level cell (MLC) system.

8. The system recited in claim 7, wherein the plurality of accumulated values takes into consideration only magnitudes of differences associated with a midpoint threshold in a voltage distribution.

9. A system for processing data, comprising:
a processor; and
a memory coupled with the processor, wherein the memory is configured to provide the processor with instructions which when executed cause the processor to:
select one or more bits in a codeword to replace with an erasure, including by:
writing a known bit pattern to at least a location on solid state storage media at which the codeword is located;
reading from the location on the solid state storage media at which the codeword is located to obtain a read bit pattern;
comparing the read bit pattern with the write bit pattern; and
selecting those bits which did not match when comparing the read bit pattern with the write bit pattern;
replace the selected bits in the codeword with the erasure; and
perform error correction decoding on the codeword with the erasure in place for the selected bits.

10. The system recited in claim 9, wherein:
the write bit pattern is a first write bit pattern;
the read bit pattern is a first read bit pattern; and
the instructions for selecting include further instructions for:
writing a second known bit pattern to at least the location on the solid state storage media at which the codeword is located;
reading from the location on the solid state storage media at which the codeword is located to obtain a second read bit pattern; and
comparing the second read bit pattern with the second write bit pattern, wherein selecting includes selecting those bits which did not match during at least one of the following comparisons: the comparison of the first read bit pattern with the first write bit pattern or the comparison of the second read bit pattern with the second write bit pattern.

11. A method for processing data, comprising:
selecting one or more bits in a codeword to replace with an erasure, including by:
selecting the one or more bits in the codeword based at least in part on a plurality of accumulated values corresponding to a plurality of bit lines; and generating the plurality of accumulated values, including by accumulating, for a bit line being analyzed, a magnitude of a difference between a soft value after error correction decoding and a soft value before error correction decoding;

replacing the selected bits in the codeword with the erasure; and using a processor to perform error correction decoding on the codeword with the erasure in place for the selected bits.

12. The method recited in claim 11, wherein the plurality of accumulated values takes into consideration only magnitudes of differences associated with successfully decoded codewords.

13. The method recited in claim 11, wherein selecting further includes:

identifying a largest accumulated value in the plurality of accumulated values; and selecting at least a bit corresponding to the largest accumulated value.

14. The method recited in claim 11, wherein selecting further includes:

identifying those accumulated values from the plurality of accumulated values which are greater than an accumulation threshold; and selecting those bits in the codeword which correspond to the accumulated values which are greater than the accumulation threshold.

15. The method recited in claim 11, wherein selecting further includes selecting the one or more bits in the codeword based at least in part on a record associated with previously selected bits.

16. The method recited in claim 15 further comprising:

recording, in the record associated with previously selected bits, a bit selected to be replaced with an erasure;

determining if a codeword containing an erasure in place of the recorded bit is successfully decoded; and in the event the codeword containing an erasure in place of the recorded bit is not successfully decoded, removing the recorded bit from the record associated with previously selected bits.

17. The method recited in claim 16, wherein the plurality of accumulated values takes into consideration only magnitudes of differences associated with a midpoint threshold in a voltage distribution.

18. A method for processing data, comprising:

selecting one or more bits in a codeword to replace with an erasure, including by:

writing a known bit pattern to at least a location on solid state storage media at which the codeword is located;

reading from the location on the solid state storage media at which the codeword is located to obtain a read bit pattern;

comparing the read bit pattern with the write bit pattern; and selecting those bits which did not match when comparing the read bit pattern with the write bit pattern;

replacing the selected bits in the codeword with the erasure; and using a processor to perform error correction decoding on the codeword with the erasure in place for the selected bits.

19. The method recited in claim 18, wherein:

the write bit pattern is a first write bit pattern;

the read bit pattern is a first read bit pattern; and selecting further includes:

writing a second known bit pattern to at least the location on the solid state storage media at which the codeword is located;

reading from the location on the solid state storage media at which the codeword is located to obtain a second read bit pattern; and comparing the second read bit pattern with the second write bit pattern, wherein selecting includes selecting those bits which did not match during at least one of the following comparisons: the comparison of the first read bit pattern with the first write bit pattern or the comparison of the second read bit pattern with the second write bit pattern.

20. A computer program product for processing data, the computer program product being embodied in a non-transitory computer readable storage medium and comprising computer instructions for:

selecting one or more bits in a codeword to replace with an erasure, including by:

selecting the one or more bits in the codeword based at least in part on a plurality of accumulated values corresponding to a plurality of bit lines; and generating the plurality of accumulated values, including by accumulating, for a bit line being analyzed, a magnitude of a difference between a soft value after error correction decoding and a soft value before error correction decoding;

replacing the selected bits in the codeword with the erasure; and performing error correction decoding on the codeword with the erasure in place for the selected bits.

21. A computer program product for processing data, the computer program product being embodied in a non-transitory computer readable storage medium and comprising computer instructions for:

selecting one or more bits in a codeword to replace with an erasure, including by:

writing a known bit pattern to at least a location on solid state storage media at which the codeword is located;

reading from the location on the solid state storage media at which the codeword is located to obtain a read bit pattern;

comparing the read bit pattern with the write bit pattern; and selecting those bits which did not match when comparing the read bit pattern with the write bit pattern;

replacing the selected bits in the codeword with the erasure; and performing error correction decoding on the codeword with the erasure in place for the selected bits.

* * * * *